United States Patent [19]
Haller et al.

[11] Patent Number: 5,258,920
[45] Date of Patent: Nov. 2, 1993

[54] LOCALLY ORIENTATION SPECIFIC ROUTING SYSTEM

[75] Inventors: Theodore R. Haller; Kenneth B. Welles, II, both of Scotia, N.Y.

[73] Assignee: General Electric Company, Schenectady, N.Y.

[21] Appl. No.: 457,023

[22] Filed: Dec. 26, 1989

[51] Int. Cl.$^5$ .............................................. G06F 15/60
[52] U.S. Cl. .................................. 364/490; 364/489; 364/488
[58] Field of Search ................ 364/489, 488, 490, 491

[56] References Cited

U.S. PATENT DOCUMENTS

| | | | |
|---|---|---|---|
| 4,752,887 | 6/1988 | Kuwahara | 364/489 |
| 4,811,237 | 3/1989 | Putatunda et al. | 364/491 |
| 4,855,929 | 8/1989 | Nakajima | 364/490 |

Primary Examiner—Vincent N. Trans
Attorney, Agent, or Firm—Marvin Snyder; Geoffrey H. Krauss

[57] ABSTRACT

A computerized router is provided with local protection regions in which the orientation of conductors in a given conductor layer is restricted to a particular orientation without affecting the allowable orientations of conductors in that layer in other portions of the routing area. Such local protection regions may apply to one or more signal conductor layers. This capability may be provided for a router which does not have it by the addition of artificial features to the components to be connected by the router. These features may be obstructions or conductors to be used in routing signal paths. Obstructions are sized and positioned to restrict conductors in the local protection regions to the desired orientation.

30 Claims, 7 Drawing Sheets

LOCALLY ORIENTATION SPECIFIC ROUTING SYSTEM

RELATED APPLICATIONS

This application relates to U.S. Pat. No. 4,835,704 entitled "An Adaptive Lithography System to Provide High Density Interconnect" by C. W. Eichelberger et al. and U.S. patent application Ser. No. 361,623 filed Jun. 5, 1989, entitled "Adaptive Lithography Accommodation of Tolerances and Chip Positioning in High Density Interconnect Structures" by T. R. Haller. Both of these are incorporated herein by reference in their entirety.

BACKGROUND OF THE INVENTION

1. Field of the Invention

This application relates to the field of high density interconnect systems, and more particularly, to the field of computerized layout of conductor patterns for high density interconnect systems.

2. Background Information

A high density interconnect (HDI) structure or system which has been developed by General Electric Company offers many advantages in the compact assembly of electronic systems. For example, an electronic system such as a microcomputer which incorporates 30–50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00 each, may be incorporated in a single system on one substrate. This repairability is a substantial advance over prior connection systems in which reworking the system to replace damaged components was either impossible or involved substantial risk to the good components.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuit and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; and U.S. patent application Ser. No. 363,646, filed Jun. 8, 1989, entitled "Integrated Circuit Packaging Configuration for Rapid Customized Design and Unique Test Capability" by C. W. Eichelberger, et al. Each of these Patents and Patent Applications is incorporated herein by reference.

Briefly, in this high density interconnect structure, a ceramic substrate (such as alumina) is provided which may be 50 to 100 mils thick and of appropriate size and strength for the overall system. This size is typically less than 2 inches square. Once the position of the various chips has been specified, individual cavities or one large cavity having appropriate depth at the intended locations of differing chips, is prepared. This is done by starting with a bare substrate having a uniform thickness and the desired size. Laser milling is then used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the substrate surrounding the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C.) depending on the formulation used and then cooled to thermoplastically bond the individual components to the cavity. Thereafter, a polyimide film which may be Kapton ® polyimide, available from E. I. du Pont de Nemours Company, which is $\approx 0.0005$–0.003 inch ($\approx 12.5$–75 microns) thick is pretreated to promote adhesion and coated on one side with the ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with contact pads on the electronic components to which it is desired to make contact. A metallization layer is deposited over the Kapton ® layer. This metallization extends into the via holes and makes electrical contact to contact pads disposed thereunder. This metallization layer may be patterned in the process of depositing it or may be deposited as a continuous layer and then patterned using photoresist and etching. The photoresist is preferably exposed using a laser to provide an accurately aligned conductor pattern at the end of the process.

Additional dielectric and metallization layers are provided as required in order to provide the desired interconnection pattern. Any misposition of the individual electronic components and their contact pads is compensated for by an adaptive laser lithography system which is the subject of the related U.S. Pat. No. 4,835,704.

In this manner, the entire interconnect structure can be fabricated from start to finish (after definition of the required conductor patterns and receipt of the electronic components) in as little as $\approx 8$–12 hours.

This high density interconnect structure provides many advantages. Included among these are the fact that it results in the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than required with other packaging techniques.

As systems being assembled in the HDI format increase in complexity, the difficulty and the computer time required to design an interconnection pattern for interconnecting all of the chips and components of an electronic system on a single high density interconnect substrate increases disproportionately. The increasing complexity can result in a need to add additional conductor layers to the high density interconnect structure in order to complete routing of all interconnections. Such additional layers complicate the fabrication process and increase the cost of the final system and the time required to produce it. A major cost is the time required for so-called rip-up passes in the routing program.

A rip-up pass is a routing pass used by the routing program when the routing program has been unable to complete all of the interconnections using constructive passes. This inability to complete all interconnections may be because of excessive interconnection density or excessive conductor congestion in parts of the routing surface. During a rip-up pass the areas in the routing plane where high congestion caused an inability to complete all routes are assigned high importance, weight or value within the router's route selection system which selects the lowest-weight successful route for a conductor. The system then removes some or all of the interconnections fixed during that previous pass and begins routing the unconnected connections. The high weight assigned to the previously heavily congested areas causes the router to route as much wiring as possible away from these high value areas. Where a second routing pass is also unsuccessful, additional values are assigned in accordance with the areas of congestion and failed routing in that second pass and a third routing pass is undertaken. Eventually, a complete successful routing of the circuit is obtained or the problem of routing a few remaining unrouted conductors is assigned to an engineer or an additional conductor layer is added to the interconnection pattern being routed to relieve congestion and provide more routes that the router can use in interconnecting the components.

Further, even in the event that the routing program is finally successful in routing all of the conductors in the desired number of layers, substantial time may be consumed in the routing process.

In a high density interconnect system of the general type discussed above, the pattern of each metallization layer and the via holes in each dielectric layer must either be individually tailored to the exact positions of the various integrated circuit chips (as placed) or an adaptive lithography system must adjust an ideal metallization and via hole pattern in accordance with the actual position of the various integrated circuit chips. In the above-identified related U.S. Pat. No. 4,835,704, this problem is solved by adaptation of an ideal metallization pattern in accordance with the actual locations of the integrated circuits chips and their contact pads by modifying the metallization pattern to properly connect to the contact pads. That adaptation is enabled by providing a "picture frame" around the allowed location of each integrated circuit chip in which adaptation of the metal layer takes place. In order to facilitate that adaptation, one of the design rules for the ideal metallization is that each metal path which crosses the picture frame must do so perpendicular to those edges of the picture frame which it crosses. The ideal metallization pattern over the chip is maintained with respect to the chip and thus, must be shifted and/or rotated with respect to the portion outside the picture frame in accordance with any shift and/or rotation of the chip with respect to its ideal location. The ideal metallization pattern beyond the outer edge of the picture frame is maintained with respect to the substrate, i.e. unchanged during the adaptation process. Adaptation to the actual chip location is accomplished by modifying the metallization pattern within the picture frame area to properly connect from the ideal metallization pattern at the outside edge of the picture frame to the shifted/rotated ideal metallization pattern over the chip. This results in the angling of conductors in the picture frame area where the chip is displaced perpendicular to, or rotated with respect to the ideal position of those connections.

Typically, hybrid routing programs enable the user to define the first layer of metal as having a preferred direction of conductor travel and the second layer of metal as having the perpendicular direction as the preferred direction of travel. Most routing programs also enable the user to make these preferences requirements. These preferences or requirements apply to the entire conductor layer. Consequently, the requirement that conductors cross the picture frame perpendicular to the picture frame edge they are crossing can be accommodated with such routing programs by requiring that the first metallization layer run in one orientation, say horizontally, and the second routing layer run in a perpendicular orientation, say vertical. We have found that one of the causes of routing congestion and the failure to complete interconnections with the Omnicards program is a result of requiring one layer of conductors to run horizontally only and the other layer of conductors to run vertically only, both horizontal and vertical being in the sense of a layout diagram on a piece of paper and not with respect to a physical orientation in which vertical might imply perpendicular to the surface of the substrate or electronic components.

In adapting the "Omnicards" hybrid circuit layout program available from Task Technologies, Inc. of Rochester, N.Y. to handle the original routing of the metal conductors in the ideal metallization pattern, we have found that the requirement that all wires cross the picture frame perpendicular to the edges thereof substantially complicates the routing process for the software, and in many cases, results in a failure to connect all modes as is required. The above-identified related application Ser. No. 361,623 solves this adaptation problem for those situations where the components can be placed with sufficient accuracy, by providing enlarged contact islands in the first layer of the ideal metallization pattern which are aligned with the ideal positions of associated contact pads on the electronic components, most of which are integrated circuit chips. So long as the components are placed with sufficient accuracy that the contact island in the first layer of the ideal metallization pattern will overlap the contact pad on the component by the amount required for an interconnecting via, no adaptation of the metallization pattern is required. Instead, the via in the dielectric layer is placed where its bottom is entirely over the contact pad and where the contact island in the first metallization layer will fully overlap it.

Use of this technique of including contact islands in the first layer of metallization eliminates the need for a picture frame area and thereby substantially simplifies the routing process as executed by the Omnicards program. Since typical pad dimensions and spacings for integrated circuit chips are 4 mils (100 microns) square, pads located on 8 mil (200 microns) centers and conductive runs in the HDI system are typically 1 mil (25 microns) wide, contact islands 2.4 mils (0.06 mm) square allow sufficient clearance for conductors to pass between adjacent contact islands designed to align with integrated circuit contact pads and will accommodate placement errors of up to about ±2 mils. Present manufacturing tolerances are not sufficiently tight to enable this contact island technique to be used with systems containing a significant number of chips.

Accordingly, there is a need for an improved routing technique which more easily accommodates the "picture frame" requirements for high density interconnect structures.

OBJECTS OF THE INVENTION

Accordingly, a primary object of the present invention is to provide a improved routing technique for hybrid circuit layout programs which will enable them to accommodate picture frame requirements in an efficient manner.

A further object of the present invention is to provide a technique enabling the routing direction in local regions of the routing surface in a routing program to be specified as requiring that all conductors extend in a given orientation without that requirement being applied to all areas of that conductor layer.

SUMMARY OF THE INVENTION

The above and other objects which will become apparent from the specification as a whole, including the drawings, are accomplished in accordance with one embodiment of the present invention by proving local protection regions in which conductor orientation is required to be in a selected direction without imposing that requirement on that conductor layer outside the local protection region. This local region protection may be applied to a single conductor layer or to all conductor layers. One way of imposing this requirement is to provide the routing program with the ability for the user to specify conductor orientation in local protection regions of the routing plane either by themselves or in association with the components which are to be interconnected by the routing program. An alternative technique which is applicable to a routing program which does not have this user specification capability is to include with each component an array of artificial features which are not an inherent part of that component, but which have the effect, in association with the system design rules, of restricting conductor orientation within the local protection regions to the desired orientation. These features may be obstructions which conductor runs must avoid. Typically, such obstructions are specified as and treated as conductors because most routers focus on conductors and keeping them at desired spacings. Alternatively, the array features may be available, unassigned conductor segments which the router can connect as a part of any node. In this alternative, the features attract, rather than repel conductors of an interconnection route.

For a rectangular component such as an integrated circuit chip, these features may preferably be a toothed or comb array which extends around the periphery of the chip in the picture frame area with that array comprised of individual short conductors which extend across the picture frame parallel to the desired direction of conductor orientation. In accordance with the conductors-to-be-avoided embodiment, the conductors of the toothed array are spaced apart in a uniform manner which allows one conductor to pass between adjacent teeth, but which prohibits bends or the placement of a via where it connects to or passes through a protected conductor layer within the picture frame area. In order for conductors to end up in the desired minimum spacing from each other, the design rules for conductor spacing and conductor width may have to be redefined during the routing process in order to allow the conductors to pass between the teeth in the desired manner. Where the conductor clearance must be artificially reduced during the routing process, component contacts pads are temporarily artificially increased in size in a reciprocal manner during the routing phase in order to obtain correct final contact-pad-to-conductor spacing.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
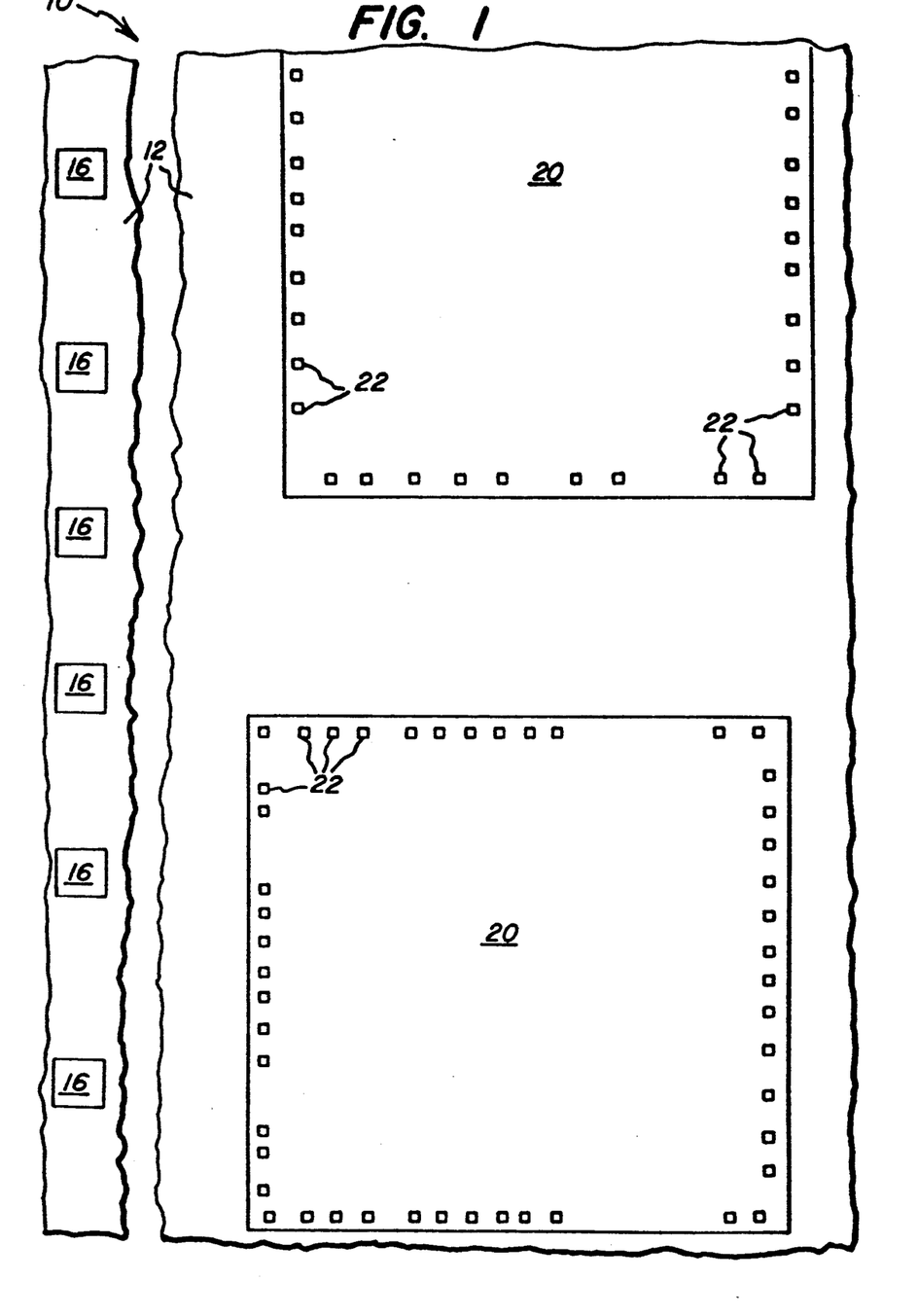
FIG. 1 is a plan view of a substrate and two integrated circuit chips and their contact pads and some substrate contact pads which are susceptible to interconnection in accordance with the present invention.

In FIG. 1, a portion of a high density interconnect circuit 10 is shown in a plan view of a substrate 12 having a plurality of substrate contact pads 16 disposed thereon and of two integrated circuits (ICs) 20 bonded thereto. Each of the integrated circuit chips 20 has a plurality of chip contact pads 22 disposed thereon. Typical pad dimensions and spacings for the integrated circuits 20 are chip contact pads 22 which are 4 mils (100 microns) square and which are located on 8 mil (200 micron) centers, i.e. contact pads 4 mils square which are separated by 4 mil spaces. The illustrated part of the structure is a small portion of the 9 ICs and 40 substrate contact pads present in the complete structure.

Figure 2:
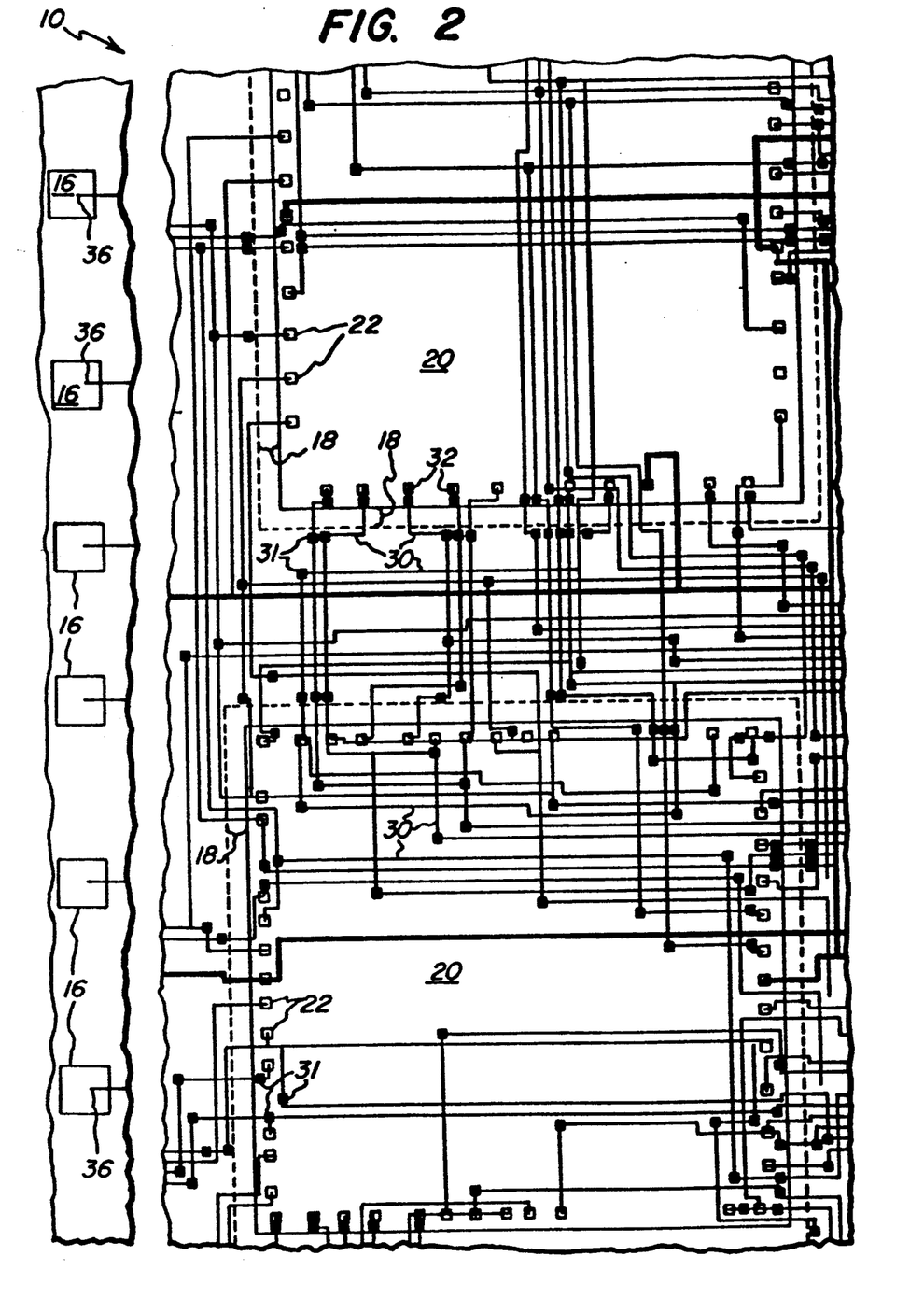
FIG. 2 is a plan view of an ideal wiring layout for the structure of FIG. 1 in accordance with related U.S. Pat. No. 4,835,704.

In accordance with the high density interconnect structure, after bonding of the integrated circuit chips to the substrate, a dielectric layer (not shown) is disposed over the substrate 12, the chips 20 and the contact pads 22 of the chips. FIG. 2 illustrates an ideal metallization pattern in accordance with the related application comprised of individual conductive runs 30 having vias 32 to contact pads 22 of the integrated circuit chips 20 and vias 36 for contact to the substrate contact pads 16. The wires which run horizontally in the figure are mostly in one layer and the wires which run vertically in the figure are mostly in a different layer and are connected where necessary through via holes in the intervening dielectric layer which are located at via pads 31.

Figure 3:
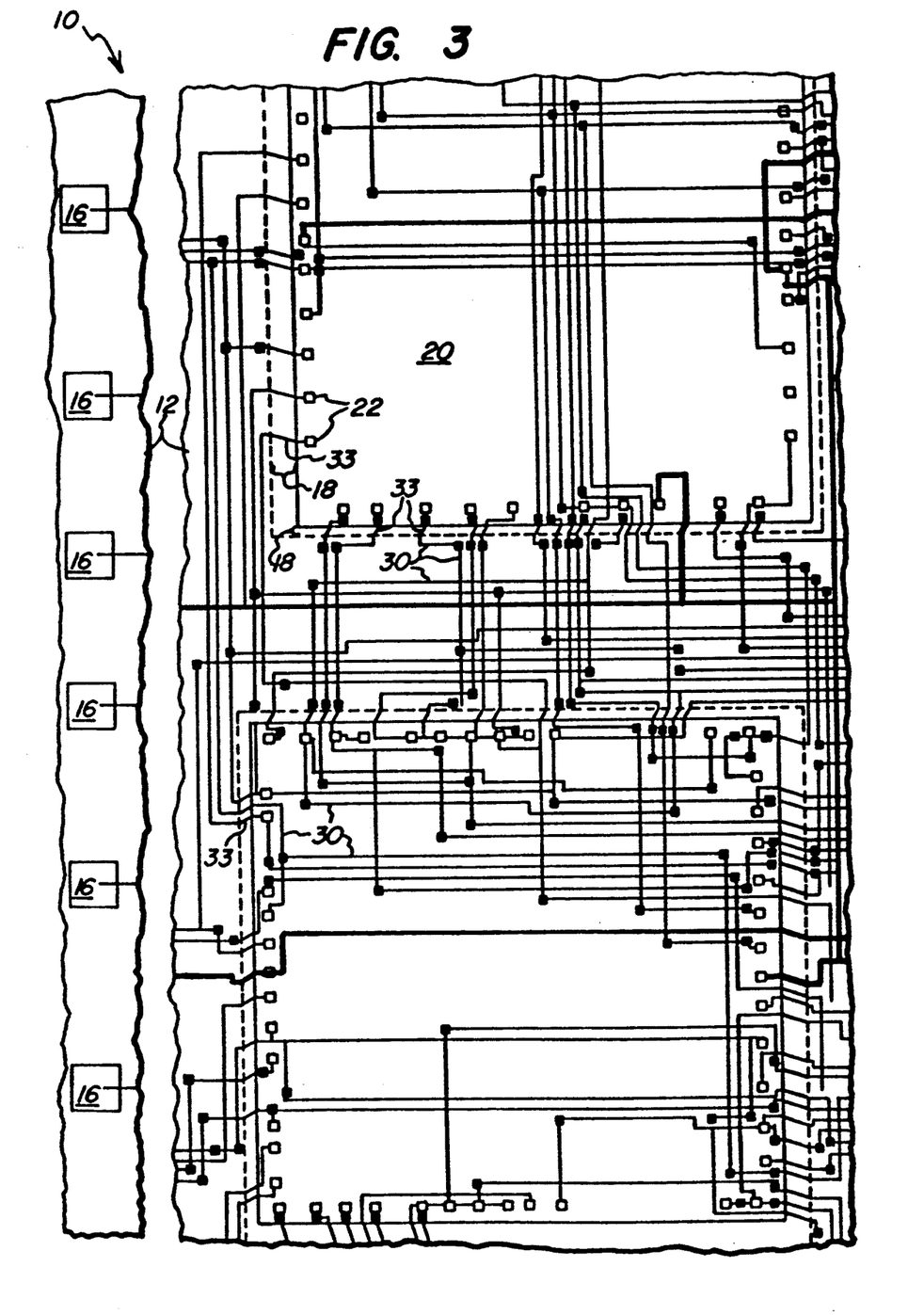
FIG. 3 is a plan view of the metallization pattern of FIG. 2 adapted in accordance with U.S. Pat. No. 4,835,704 for displacement of the integrated circuit chips from their ideal locations.
Figure 4:
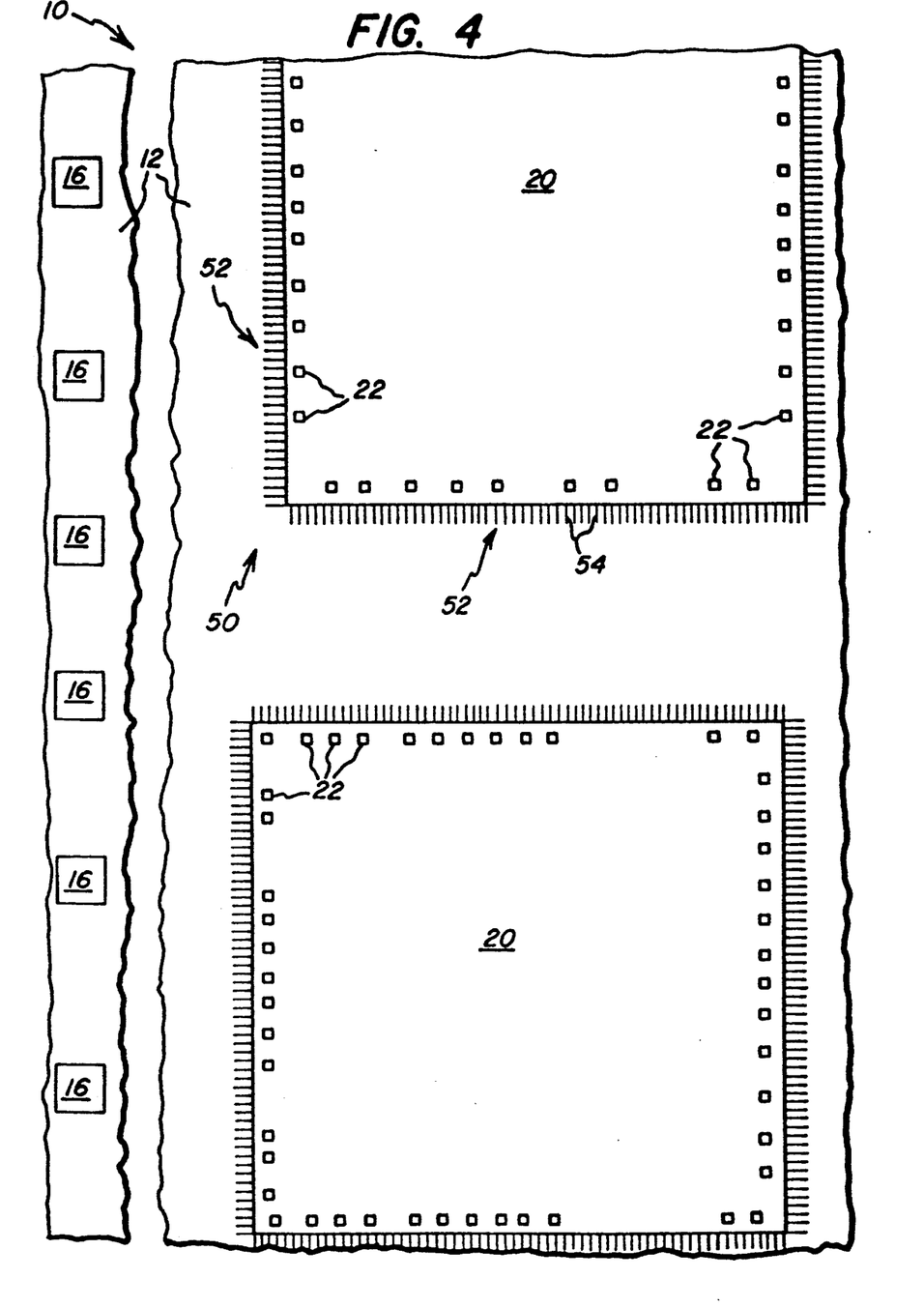
FIG. 4 is a plan view similar to FIG. 1 in which artificial obstructions have been co-placed with the integrated circuits to control conductor orientation in the picture frame region.

In FIGS. 2–4, the via pads 31 of the conductive runs where a via hole to a different layer of metal is located (i.e. where a vertical run becomes horizontal or vice versa) are exaggerated in size as compared to the chip contact pads. These enlargements at vias are typically about 2.4 mils (0.06 mm) square and are for the purpose of ensuring that the via hole is located entirely over the underlying metal and entirely under the overlying metal. The conductive runs 30 are typically 1 mil (25 microns) wide.

A picture frame region 18 is established around each of the integrated circuit chips 20 in which adaptive modification of the ideal metallization pattern is provided to compensate for tolerances in chip placement in accordance with U.S. Pat. No. 4,835,704.

The ideal conductor layout illustrated in FIG. 2 employs 200 micron (8 mil) wide picture frames. This enables the system of the related application to compensate for placement errors of up to 4 mils since the maximum tolerance on chip placement is preferably one half of the picture frame width in order to prevent adaptation of conductors within the picture frame from violating design rules on conductor spacing. Routing the ideal wiring shown in FIG. 2 required two hours of CPU time to perform the routing for the entire system using the "Omnicards" routing software and involved several unsuccessful attempts at routing which were unable to complete all routes.

Eventually, a completely successful routing of this circuit was obtained. However, it required substantially more computer time than would be required without the rip up passes. This long routing time is an indication that if the wiring were somewhat more complex, it would become impossible to route the circuit with two layers of interconnection - one horizontal in the figure and one vertical in the figure.

FIG. 3 is a plan view illustration similar to that in FIG. 2 in which the two illustrated integrated circuit chips are displaced from their ideal locations, the upper chip being displaced downward to the right and the lower chip being displaced upward to the left. In FIG. 3, conductive runs 30 have been modified within the picture frame area 18 as at 33 to properly connect the conductors of the shifted/rotated ideal pattern which is maintained in ideal alignment with the integrated circuit chips over the integrated circuit chips to the conductors of the ideal pattern which is maintained outside the picture frame 18. As is discussed in the related application Ser. No. 361,623, we have found that the requirement that the conductors in the ideal layout cross the picture frames perpendicular to the frame edges unnecessarily complicates the process of routing the conductors in the ideal pattern when the routing is done using the Omnicards routing software. Therefore, an alternative customization or adaptation technique was needed in which the picture frame and the requirements for the conductors to run perpendicular to the edges of the picture frame within the picture frame could be accommodated within the "Omnicards" routing system in a manner which allows routing of complex systems in a reasonable period of time and in a manner which accommodates more complex systems.

We determined that the routing problem would be simplified and the time required to route the interconnections in complex systems would be reduced if the routing program were modified to enable local regions to be defined as orientation protected within one or more of the signal conductor layers without affecting the orientation of conductors in other parts of that conductor layer or layers.

The present invention is applicable to computerized processes for determining conductor locations for an interconnection pattern for a multi-component electronic circuit of a type in which a computer software receives, as an input, a specification of the electronic components and their interconnections which are to be placed and routed and provides as an output, a specification of the positions of the various components and the pattern of interconnections in a form which is suitable for controlling the fabrication of an interconnection pattern which will provide the specified component connections when the components are positioned as specified and provided with the specified conductor pattern. It is suitable for use with such systems whether the system itself determines placement of the components or whether the component placement is part of the input information. Typically, such systems employ a router program which test potential routes for completing a specified connection, with the locations tested being restricted to being within a defined routing area or surface which may include one or more conductor layers and which typically includes at least two conductor layers. The routing program finds a route which is wholly within the routing area and which will complete the specified connection. If more than one such route is located, the one with the least cost in accordance with the routing program's hierarchy of costs is selected as the route for that connection and the routing program proceeds to the routing of another conductor. A variety of different techniques may be used within the routing program for seeking a route to complete the connection being routed. This technique is applicable to all such routing techniques.

The manner of that output and its conversion to a physical circuit depends on the type of circuit being designed. When a printed circuit board is being designed, the system typically controls the pattern of exposure of the circuit board conductors either directly through laser writing of the pattern on photoresists, or more commonly, by controlling mask making equipment to produce a mask having the required pattern.

In the HDI system, this output information is provided in a form suitable for driving a laser to define the pattern in which a particular layer of metallization is deposited on the HDI structure or the pattern in which a continuous metal pattern which has been deposited is removed to leave the desired interconnection pattern. This same output data controls the formation of via holes which interconnect different layers of metallization in the high density interconnect structure.

Since we did not have access to the source code for the Omnicard's routing software, we were unable to directly modify that software. Accordingly, we developed a "toothed array" technique which, by brute force, provides this ability.

Figure 5:
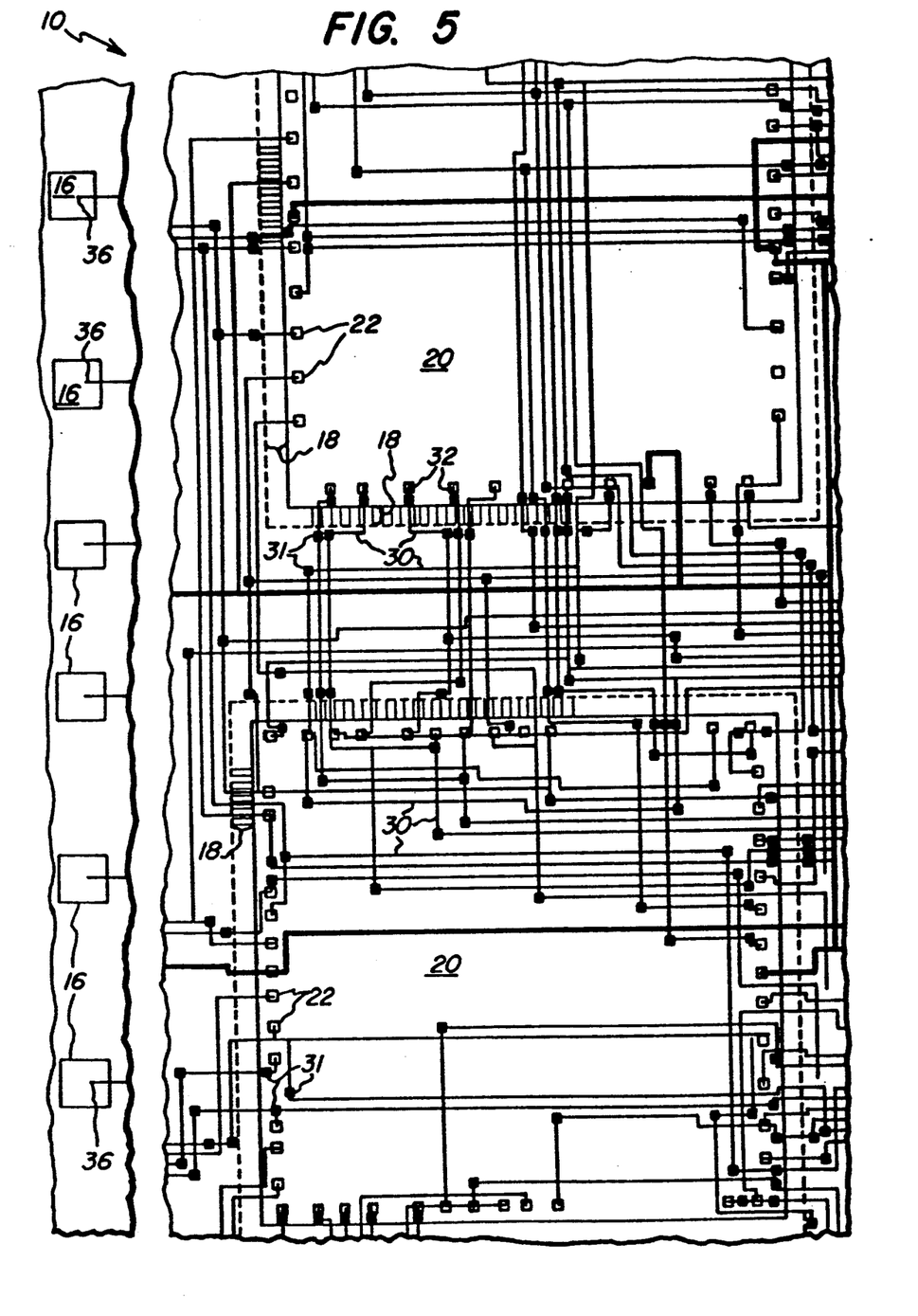
FIG. 5 is an illustration similar to FIG. 2 showing the pattern of conductor placement with respect to the teeth of the toothed array.
Figure 6:
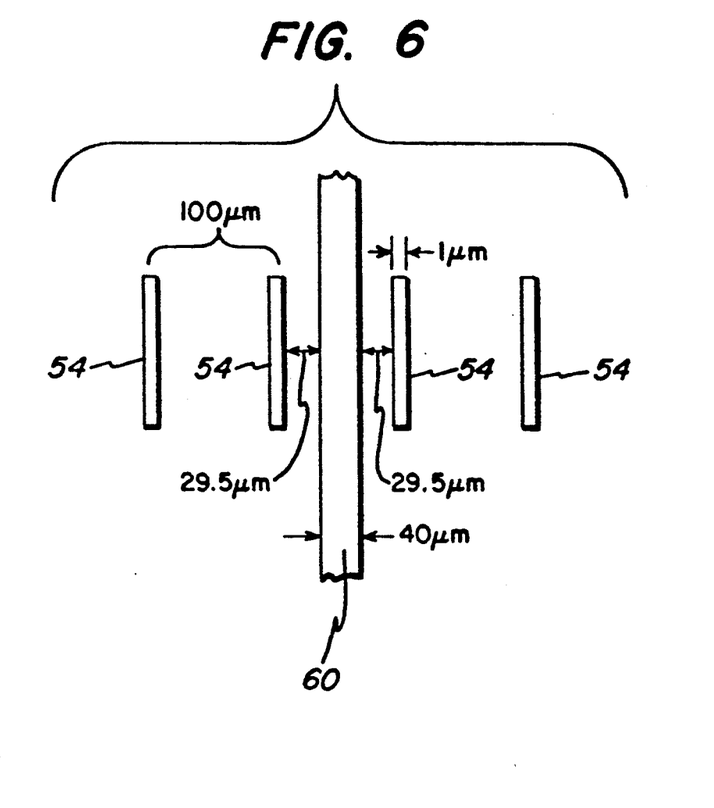
FIG. 6 is a detail showing the manner in which only a single conductor is able to pass between adjacent teeth of the array and the manner in which a via may not be placed within the area of the toothed array.

In FIG. 4, the FIG. 1 structure is illustrated with a toothed array 50 co-placed with each of the chips 20. This toothed array comprises four separate toothed array segments 52. In each of these toothed array segments 52, there is an array of teeth 54, each of which is 200 microns long by 1 micron (1 $\mu$m) wide and they are disposed on 100 micron centers. These teeth constitute obstructions designed to interact with the system design rules to protect a picture frame 18 which is 200 microns wide. The 100 micron center-to-center space of the teeth of the array is picked to match the grid of the Omnicard router which is set for our HDI layouts with a 100 micron grid. The teeth 54 of each array segment 52 are preferably placed offset by 50 microns from the Omnicards grid. In this way, conductors were run straight through the local protection region created by the toothed array as is shown in FIG. 5, where only some of the teeth 54 of the toothed array 50 are shown, it being understood that all of the teeth shown in FIG. 4 are also present in FIG. 5 during the routing phase. The manner in which this toothed array controls conductor placement and orientation is illustrated in detailed form in FIG. 6. In FIG. 6, four of the teeth 54 of a toothed array segment 52 are illustrated. These teeth are 1 micron wide in the X-direction, spaced apart on 100 micron centers in the X-direction and 200 microns tall in the Y-direction, and thus are not drawn to scale in the figure. A conductor 60 is shown passing vertically between two of the teeth. The conductor 60 is 40 microns wide and thus has a clearance of 29.5 microns on each side of it when centered between the teeth 54. Since the desired trace or conductor width in the final circuit is 40 microns, a trace to adjacent conductor clearance of 29 microns is specified to the routing program for the routing phase.

In actuality, a clearance of 48 microns is the design rule for the circuit. Since the routing program requires a single clearance parameter for the whole structure, the clearance between a trace and a contact pad of an integrated circuit chip could be smaller than required without further modifications to the system. Consequently, the actual 62 microns square chip pads are artificially increased to be 100 microns square which is the actual 62 micron chip pad size plus twice the diminution of 19 microns in trace clearance which has been specified in order to allow conductors to pass between the array teeth 54.

This toothed array structure successfully limits conductor runs to being in the desired orientation in the local protection regions without affecting the direction of conductor runs elsewhere in the routing plane. A particular advantage of this toothed array structure is that it is applied to all signal conductor layers with the result that conductors may be run horizontally in all signal layers along the vertical sides of the chips 20 in FIG. 4. This provides the potential for twice as many conductors crossing the picture frame area in those locations as is possible when the router is specified to rigidly require all conductors in a first signal run to run horizontally and all conductors in a second signal run to run vertically in the figure as a means of controlling conductor orientation in crossing the picture frame. After the completion of the routing process, the artificial toothed array is removed or eliminated, the chip contact pads are returned to their actual 62 micron size with the result that the routing clearance is returned to its actual 48 micron size for conversion of the conductor pattern determined by the routing phase of the overall process into the output information which is suitable for controlling the fabrication of a high density interconnect structure.

Since via contact pads have a defined width of 62 microns, a via cannot be placed between two of the teeth 54 without violating the design rules as specified to the routing program.

To test the affect of this toothed array on conductor routability, three test cases were run. Each test case involved the same component and connection specification. In case #1, the circuit was run through four autorouting passes with no provision for adaptive design rules. In case #2, the circuit was run through the same four passes using the restricted layer orientation technique. In case #3, the circuit was run through the same four passes using the local protection region technique of this invention in the form of the toothed array offset from the routing grid. Each of the passes involves expanding the size of the area in which the router can route a route. That is, in the first path, the router is constrained to keep routes within a limited distance of a direct path between the points to be connected in order to avoid blocking routes in distant portions of the routing space. Each successive pass expands the region in which the router is permitted to place a conductor which interconnects the same two points. The results are shown in the table:

TABLE

| Pass | No restraint pass rate | % comp. | Restricted layer pass rate | % comp. | Toothed array pass rate | % comp. |
|---|---|---|---|---|---|---|
| 1 | 33.1 | 8.0 | 23.9 | 5.8 | 25.4 | 6.1 |
| 2 | 61.4 | 48.1 | 49.4 | 39.2 | 60.7 | 46.9 |
| 3 | 39.6 | 58.1 | 33.7 | 50.7 | 41.0 | 57.8 |
| 4 | 14.4 | 60.3 | 11.9 | 53.4 | 20.7 | 61.0 |

The data tabulated in the table prior to reaching the rip-up stage, and thus does not represent the completion which the system would eventually provide. As the table shows, the no restraint and the toothed array techniques had similar completion characteristics at this stage of the routing process, while the restrict layer approach was decidedly inferior. The fact that by the end of the fourth pass, the toothed array is superior to "no restraint" is thought to be a result of the toothed array forcing the connections into a more regular pattern than "no restraint" provides, with a consequent lesser blockage of "long" routes as the routing space becomes more crowded with already routed conductors.

The toothed array is preferably generated and co-placed with the components by use of the same part and package creation algorithm which is used to generate real parts and packages for the high density interconnect structure. This enables the toothed array to be matched to the chip.

For use to protect the picture frame area of the substrate in an high density interconnect structure, the toothed array's conductors are defined as extending through all signal routing layers of the structure to locally control the orientation of the routing conductors in those regions.

One disadvantage of this toothed array approach to the picture frame protection problem is that with the conductors 54 placed off grid, the routing program converts to a 50 micron grid in order to handle the routing around these off grid conductors.

The just-described technique is a data-based technique (as opposed to a programing based technique) which is suitable for use with a router to which one does not have access to the source code to modify the router internally to provide the desired local protection regions in order to control the orientation of conductors in the local protection regions without imposing that orientation on other portions of that conductor layer outside the local protection region. It is preferred instead, to modify the router source code or provide a new router having the feature or characteristic of permitting the user to specify local protection regions which are orientation protected within the local protection region without affecting the area outside that protection region. Via protection for this local protection region may also be provided if desired. Such protection is desirable in the HDI structure to prevent short circuits cause by displacement of chips from their ideal location. This may be done by providing for the specification of local protection regions as a special type of component whose only characteristic is orientation and/or via control. This feature may be embodied in any other aspect of the routing program in accordance with the programmer's preferences or other criteria.

Figure 7:
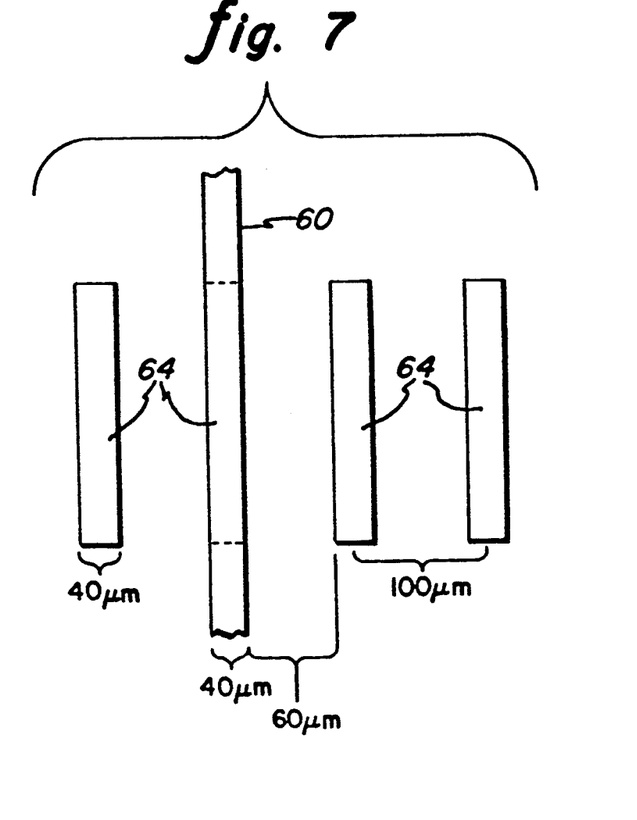
FIG. 7 illustrates a portion of a structure including available, unassigned conductive teeth.

With a router which is capable of connecting conductors which are defined as being present, but are initially unassigned to any particular node as part of the route which completes a connection, orientation control is preferably provided by placing the teeth of the array on the routing grid, rather than offset from it and making the teeth specified conductors which are unassigned to any node. This has several advantages. First, the Omnicards router stays in a 100 μm grid mode, this reduces the number of grid points by a factor of four which reduces routing time and memory requirements by about a four to one reduction. Second, it becomes unnecessary to modify routing clearances and chip contact pads sizes. An example of such a structure is shown in FIG. 7, where the conductive teeth of the array are identified by the reference number 64. One routed conductor 60 is shown coincident with one of the teeth 64. The ends of that tooth are shown in phantom for clarity. With the design rules specified above, the resulting conductor teeth are 40 microns wide and positioned on 100 microns centers. This leaves 60 microns of clearance between adjacent teeth, which with a 48 micron clearance required between adjacent conductors, prevents the placement of a 40 micron trace between adjacent teeth, since such a trace would have a maximum equal clearance of only 10 microns on a side. Using this technique, once the routing phase is complete, all teeth of the array which are not then part of a node, may be deleted from the structure to avoid the inclusion of unnecessary conductors in the structure and to thereby simplify the fabrication of the final structure.

In this embodiment, vias cannot be placed in the local protection region because the conductor teeth 64 are too narrow for the placement of a via thereon and the router is forbidden to widen a specified conductor in order to place a via on it.

Alternatively, the router may be modified to have or provide a "HDI mode" in which the system automatically adds a local protection region along each edge of an integrated circuit or other component where picture frame protection is required. In that situation, the user only needs to specify the HDI mode and the local protection regions are automatically added to or co-placed with or made a characteristic of the component.

For greatest versatility, such a router should provide the ability to assign protection regions to only selected ones of the components or only along selected sides of the component or along selected portions of a side of the component, as may be considered desirable in particular applications.

The specific manner in which the router limits the orientation of the conductors in the local protection region will vary in accordance with design choices which may be influenced by the manner in which the router handles other restrictions.

While in the HDI structure it is apparent that a local protection region should apply to all signal conductor layers passing therethrough, there may well be other applications where the protection only needs to apply to selected ones of the signal conductor layers. In general, it is not necessary to apply protection to ground conductor planes, since the ground planes themselves only interact with other layers at vias and the locations of those vias are defined by the other layers, not the ground plane. The same is true for power planes where the power conductor traces are sufficiently wide that adaptation of their conductors is unnecessary because their conductors are assured of overlapping their intended via or contact locations so long as the components are placed within the specified tolerance of the pick and place equipment.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A routing method employing a computer for routing conductors of an interconnection pattern for a multicomponent electronic circuit while restricting routed conductors to a particular orientation in at least one local protection region without affecting other portions of a routing area, said routing method comprising the steps of:

establishing a specification of electronic components and their interconnections;

establishing a routing area which includes one or more layers;

establishing a first local protection region in said routing area; and determining a pattern of interconnections in a form suitable for controlling the fabrication of an interconnection pattern which will provide the specified interconnections by testing potential routes for completing a specified connection, with the locations tested being restricted to being within the routing area, finding a route which is wholly within the routing area, which is restricted to a first orientation in a first one of said layers within said first local protection region and not restricted to said first orientation in other portions of said first layer and which will complete the specified connection while preventing the creation of a conductor via which connects to or passes through said first local protection region, fixing on that route for that connection, and proceeding to the routing of another conductor;

whereby said first layer is subject to local orientation protection within said first local protection region.

2. The routing method recited in claim 1 further comprising:

establishing a second local protection region in said routing area; and wherein said step of determining a pattern of interconnections includes finding a route which is restricted to a second orientation in said first one of said layers within said second local protection region, said second orientation being different from said first orientation;

whereby said first layer is subject to local orientation protection within said first local protection region.

3. The routing method recited in claim 2 wherein said step of determining a pattern of interconnections includes preventing the creation of a via which connects to or passes through said first layer within a region where said first layer is subject to local orientation protection.

4. The routing method recited in claim 2 wherein said step of determining a pattern of interconnections includes finding a route which is restricted to said second orientation in said second one of said layers within said second local protection region, whereby said second layer is subject to local orientation protection within said second local protection region.

5. The routing method recited in claim 4 wherein said step of determining a pattern of interconnections includes preventing the creation of a via which connects to or passes through any of said layers within a region where said that layer is subject to local orientation protection.

6. The routing method recited in claim 4 wherein said steps of establishing first and second local protection regions comprise:

including with said specification of components an array of artificial features for each local protection region, said array of artificial features not being an inherent part of said electronic components, said array comprising a feature pattern having an effect which, in association with system design rules, will restrict conductor orientation within that local protection region in its protected layers to its associate protection orientation.

7. The routing method recited in claim 6 wherein:

said artificial features are treated as obstructions during said step of determining a pattern of interconnections.

8. The routing method recited in claim 7 wherein:
said obstructions are treated as conductors during said step of determining a pattern of interconnections.

9. The routing method recited in claim 4 wherein said steps of establishing first and second local protection regions comprise:
including with said specification of components an array of artificial conductors for each local protection region, said array of artificial conductors not being an inherent part of said electronic components, said artificial conductors initially being unassigned to any node and available for assignment to any node as part of an interconnection which is part of that node, said artificial conductors being sized and positioned in a manner which, in association with system design rules will restrict conductor orientation within each local protection region to that protection regions specified orientation.

10. The routing method recited in claim 1 wherein said step of determining a pattern of interconnections includes finding a route which is restricted to said first orientation in a second one of said layers within said first local protection region and not restricted to said first orientation in other portions of said second layer, whereby said second layer is subject to local orientation protection within said first local protection region.

11. The routing method recited in claim 10 wherein said step of determining a pattern of interconnections includes preventing the creation of a via which connects to or passes through any of said layers within a region where said that layer is subject to local orientation protection.

12. A routing method employing a computer for routing conductors of an interconnection pattern for a multicomponent electronic circuit while restricting routed conductors to a particular orientation in at least one local protection region without affecting other portions of a routing area, said routing method comprising the steps of:
establishing a specification of electronic components and their interconnections;
establishing a routing area which includes one or more layers;
establishing a first local protection region in said routing area by including with said specification of components an array of artificial features which are not an inherent part of said components, said array comprising a feature pattern having an effect which, in association with system design rules, will restrict conductor orientation within said first orientation; and
determining a pattern of interconnections in a form suitable for controlling the fabrication of an interconnection pattern which will provide the specified interconnections by testing potential routes for completing a specified connection, with the locations tested being restricted to being within the routing area, finding a route which is wholly within the routing area, which is restricted to a first orientation in a first one of said layers within said first local protection region and not restricted to said first orientation in other portions of said first layer and which will complete the specified connection, fixing on that route for that connection, and proceeding to the routing of another conductor;
whereby said first layer is subject to local orientation protection within said first local protection region.

13. The routing method recited in claim 12 wherein:
said artificial features are treated as obstructions during said step of determining a pattern of interconnections.

14. The routing method recited in claim 13 wherein:
said obstructions are treated as conductors during said step of determining a pattern of interconnections.

15. The routing method recited in claim 14 wherein:
said array comprises a pattern of conductors oriented substantially parallel to said first orientation.

16. The routing method recited in claim 15 wherein:
said conductors have a defined width in a direction perpendicular to said first orientation which in combination with system design rules makes the gap between two adjacent ones of said conductors wide enough to permit a single conductor to be disposed between those adjacent conductors, but too narrow to permit two conductors to be disposed in said gap.

17. The routing method recited in claim 16 wherein:
said gap is too narrow to permit a via to be disposed in said gap.

18. The routing method recited in claim 17 further comprising:
changing a minimum conductor-to-conductor clearance specification to enable routing of conductors in the toothed array region in the protected manner.

19. The routing method recited in claim 18 further comprising the step of:
changing the specified sizes of component contact pads in a reciprocal manner for the pattern-determining step of the process to maintain system design rules in an actual physical circuit built in accordance with the determined pattern of interconnections.

20. The routing method recited in claim 19 further comprising the step of:
after completion of the pattern-determining step of the process changing the specified sizes of said contact pads to their originally specified sizes.

21. The routing method recited in claim 16 wherein:
said conductors have a first orientation length which is substantially the same as a first orientation length of said first local protection region.

22. The routing method recited in claim 12 further comprising, after said array of artificial features has served its purpose of establishing the orientation of conductors within said local protection regions, the step of:
removing said array of artificial features.

23. The routing method recited in claim 12 wherein:
artificial features are artificial conductors which are not an inherent part of said components, said artificial conductors having said first orientation, initially being unassigned to any node and available for assignment to any node as part of an interconnection which is part of that node, said artificial conductors being sized and positioned in a manner which, in association with the system design rules will restrict conductor orientation within said first local protection region in said first layer to said first orientation.

24. A routing method employing a computer for routing conductors of an interconnection pattern for a multicomponent electronic circuit while restricting routed conductors to a particular orientation in at least one local protection region without affecting other portions of a routing area, said routing method comprising the steps of:

establishing a specification of electronic components and their interconnections;

establishing a routing area which includes one or more layers;

establishing a first local protection region in said routing area by including with said specification of components an array of artificial conductors which are not an inherent part of said components, said artificial conductors having said first orientation, initially being unassigned to any node and available for assignment to any node as part of an interconnection which is part of that node, said artificial conductors being sized and positioned in a manner which, in association with system design rules will restrict conductor orientation within said first local protection region in said first layer to said first orientation; and determining a pattern of interconnections in a form suitable for controlling the fabrication of an interconnection pattern which will provide the specified interconnections by testing potential routes for completing a specified connection, with the locations tested being restricted to being within the routing area, finding a route which is wholly within the routing area, which is restricted to a first orientation in a first one of said layers within said first local protection region and not restricted to said first orientation in other portions of said first layer and which will complete the specified connection, fixing on that route for that connection, and proceeding to the routing of another conductor;

whereby said first layer is subject to local orientation protection within said first local protection region.

25. The routing method recited in claim 24 wherein:
said conductors have a defined width in direction perpendicular to said first orientation which in combination with the system design rules makes the gap between two adjacent ones of said conductors too narrow to permit a single conductor to pass between those adjacent conductors.

26. The routing method recited in claim 25 wherein:
the design rules prevent placement of a via on any of said artificial conductors.

27. The routing method recited in claim 26 wherein:
said defined width is too narrow for the design rules to permit placement of a via on any of said artificial conductors.

28. The routing method recited in claim 24 further comprising the step of:
after completion of the pattern-determining step of the process, deleting from the structure any of said artificial conductors which has not been assigned to a node.

29. The routing method recited in claim 24 wherein:
said artificial conductors have a first orientation length which is substantially the same as a first orientation length of said first local protection region.

30. The routing method recited in claim 24 further comprising, after said array of artificial conductors has served its purpose of establishing the orientation of conductors within said local protection regions, the step of:
removing those artificial conductors which have not been assigned to a node.

* * * * *